United States Patent
Zhang

(10) Patent No.: US 9,246,464 B2
(45) Date of Patent: Jan. 26, 2016

(54) MAGNETIC INTERFACE CIRCUIT HAVING A 3-WIRE COMMON MODE CHOKE

(71) Applicant: HON HAI PRECISION INDUSTRY CO., LTD., New Taipei (TW)

(72) Inventor: Jie Zhang, Kunshan (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/250,638

(22) Filed: Apr. 11, 2014

(65) Prior Publication Data

US 2014/0306781 A1   Oct. 16, 2014

(30) Foreign Application Priority Data

Apr. 11, 2013  (CN) .......................... 2013 1 0126133

(51) Int. Cl.
*H03H 7/09* (2006.01)
*H03H 7/01* (2006.01)
*H03H 7/42* (2006.01)

(52) U.S. Cl.
CPC ............... *H03H 7/0115* (2013.01); *H03H 7/09* (2013.01); *H03H 7/427* (2013.01)

(58) Field of Classification Search
CPC ........ H03H 7/09; H03H 7/0115; H03H 7/427
USPC .......................................................... 333/177
See application file for complete search history.

(56) References Cited

U.S. PATENT DOCUMENTS

| | | | |
|---|---|---|---|
| 4,904,973 A * | 2/1990 | Ikeda | ............................. 336/69 |
| 7,123,117 B2 | 10/2006 | Chen et al. | |
| 7,445,507 B1 | 11/2008 | Parker | |
| 7,524,206 B2 | 4/2009 | Gutierrez et al. | |
| 7,575,478 B1 * | 8/2009 | Wei | ........................... 439/620.11 |
| 7,708,595 B2 | 5/2010 | Chow et al. | |
| 7,808,751 B2 | 10/2010 | Chen et al. | |
| 7,884,687 B2 | 2/2011 | Lee | |
| 8,077,004 B2 | 12/2011 | Buckmeier et al. | |
| 2010/0061387 A1 | 3/2010 | Chen | |
| 2011/0304411 A1 * | 12/2011 | Zhang | ................. H01R 23/688 333/177 |

FOREIGN PATENT DOCUMENTS

TW                201310903          3/2013

* cited by examiner

*Primary Examiner* — Benny Lee
*Assistant Examiner* — Rakesh Patel
(74) *Attorney, Agent, or Firm* — Ming Chieh Chang; Wei Te Chung

(57) ABSTRACT

A magnetic interface circuit for interfacing between a cable side and a circuit side of a networking communication channel. The magnetic interface circuit includes a transformer and a 3-wire common mode choke (CMC). The transformer has a first winding connected to the cable side of the channel and a second winding connected to the circuit side of the channel. Each of the first and second windings has two output ports. The 3-wire CMC has a center winding and two outer windings respectively connected to the output ports of the first or second winding. The center winding has two opposite ends both used for connecting to ground.

15 Claims, 4 Drawing Sheets

MAGNETIC INTERFACE CIRCUIT HAVING A 3-WIRE COMMON MODE CHOKE

BACKGROUND OF THE INVENTION

1. Field of the Invention

The present invention relates to a magnetic interface circuit used for a modular jack connected between a network cable and a circuit board.

2. Description of Related Art

U.S. Pat. No. 7,123,117, issued to Chen et al. on Oct. 17, 2006, discloses a magnetic interface circuit for interfacing between a cable side and a circuit side of a networking communication channel. The magnetic interface circuit has two transmit channels each including a transformer and a 3-wire common mode choke (CMC) connected with each other. The transformer has a first winding connected to the cable side of the channel and a second winding connected to the circuit side of the channel. Each of the first and second windings has two output ports. The 3-wire CMC has a middle or center winding and two outer windings. The outer windings are respectively connected to the output ports of the first or second winding. The center winding has an end connected with a center tap of the transformer and another end connected with a power supply (V+). High frequency noise transmitted through the two outer windings could be coupled to the center winding and reflected back between the center tap of the transformer and the center winding of the 3-wire CMC, affecting filtering performance (common mode noise reduction). Moreover, the noise of a power supply could also reflect back between the center tap of the transformer and the center winding of the 3-wire CMC. A modular jack having such magnetic interface circuit could be easily made through a slight circuit change on an inner printed circuit board of an existing modular jack, such as disclosed in U.S. Pat. No. 7,708,595.

A magnetic interface circuit having improved filtering performance is desired.

SUMMARY OF THE INVENTION

It is an object of the present invention to provide a new magnetic interface circuit configuration, which provides greatly improved filtering performance compared the existing magnetic interface circuit under high speed transmit.

In order to achieve the object set forth, the invention provides a magnetic interface circuit for interfacing between a cable side and a circuit side of a networking communication channel. The magnetic interface circuit includes a transformer and a 3-wire CMC. The transformer has a first winding connected to the cable side of the channel and a second winding connected to the circuit side of the channel. Each of the first and second windings has two output ports. The 3-wire CMC has a center winding and two outer windings respectively connected to the output ports of the first or second winding. The center winding has two opposite ends both used for connecting to ground.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
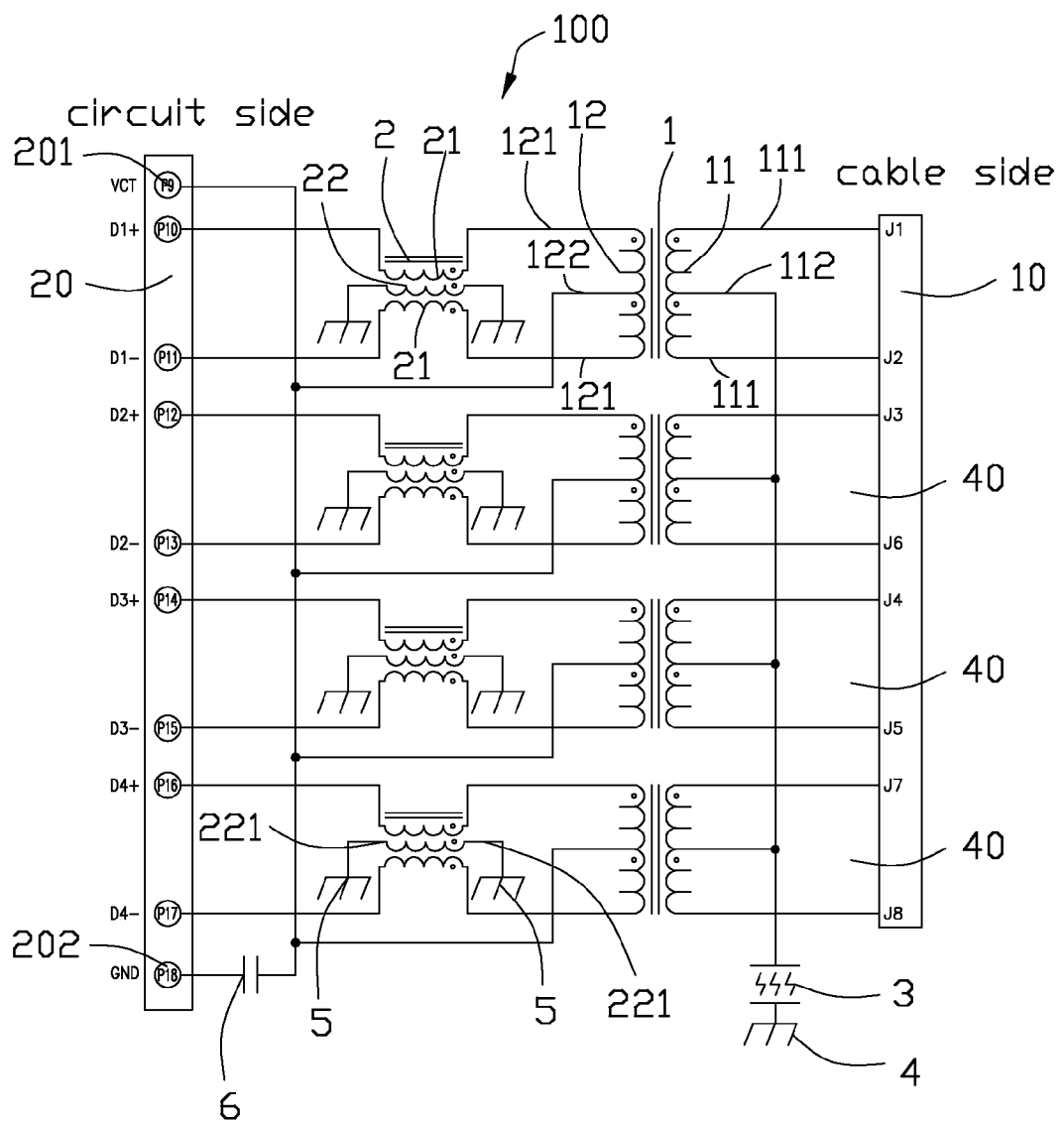
FIG. 1 shows a magnetic interface circuit of a first embodiment in accordance with the present invention.

FIG. 1 is a magnetic interface circuit 100 of a first embodiment in accordance with the present invention.

The magnetic interface circuit 100 is used for a modular jack connecting between a network cable and a circuit board and is interfaced between a cable side 10 and a circuit side 20 of a networking communication channel. The magnetic interface circuit 100 includes four transmit channel 40. Each transmit channel 40 is identical and includes an isolation transformer 1 and a 3-wire CMC 2 with one of the windings of the isolation transformer 1 connected to the cable side 10 and the 3-wire CMC 2 connected between the other winding of the isolation transformer 1 and the circuit side 20 of the channel. The transformer 1 has a first winding 11 connected to the cable side 10 and a second winding 12 connected to the circuit side 20. The first winding 11 has two outputs 111 connected to the cable side 10 and a first center tap 112 connected to a discharge device 3 for connecting to ground 4. The discharge device 3 is formed of two adjacent conductive pads disposed on a printed circuit board. The discharge device 3 also could be replaced by a capacitor or a capacitor connecting with four resistors (Bob-smith circuit). The second winding 12 has two outputs 121 and a second center tap 122 connected to the circuit side 20. The 3-wire CMC 2 has a middle or center winding 22 and two outer windings 21. The two outer windings 21 is connected between the two outputs 121 of the second winding 12 and the circuit side 20. The center winding 22 does not connect with the transformer 1 but has two opposite ends 221 both used for connecting to ground 5. The circuit side 20 has a power supply 201 and a grounding point 202. The power supply 201 is parallel connected with the grounding point 202. The second center tap 122 is series connected with the power supply 201 and the grounding pointing 202 respectively. There is a capacitor 6 series connected between the second center tap 122 and the grounding point 202.

Figure 3:
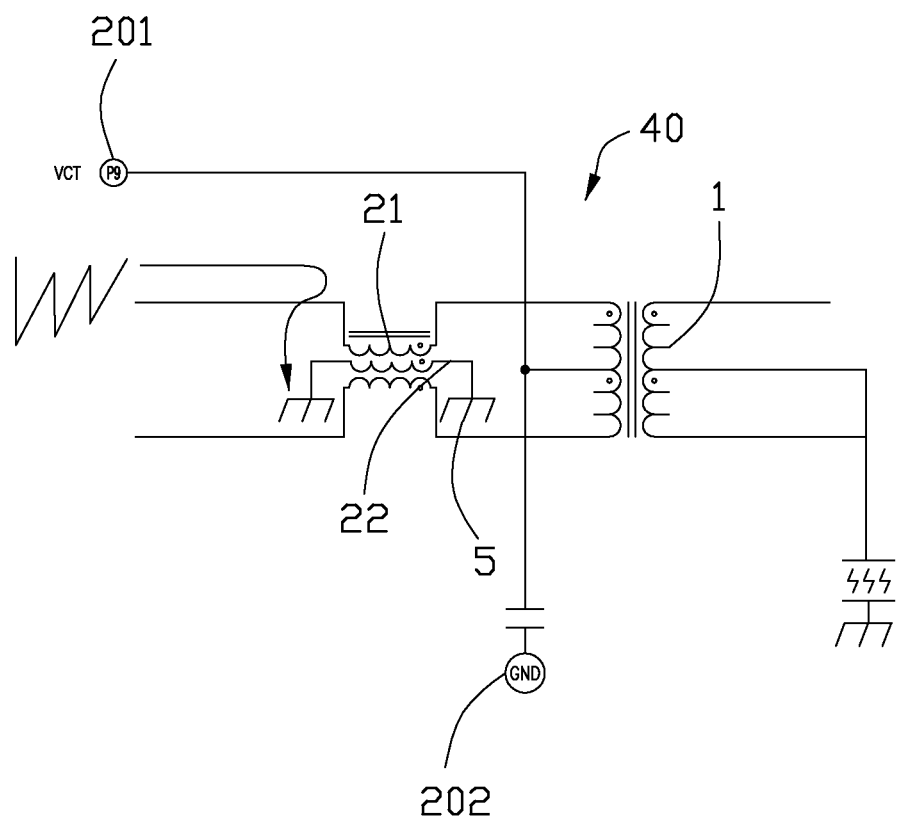
FIG. 3 shows a transmit channel of the magnetic interface circuit of FIG. 1 transmitting a high frequency noise.

FIG. 3 shows a transmit channel 40 of the FIG. 1 transmitting a high frequency noise. High frequency noise is transmitted through the two outer windings 21 and could be coupled to the center winding 22 and directly absorbed to ground 5.

Figure 4:
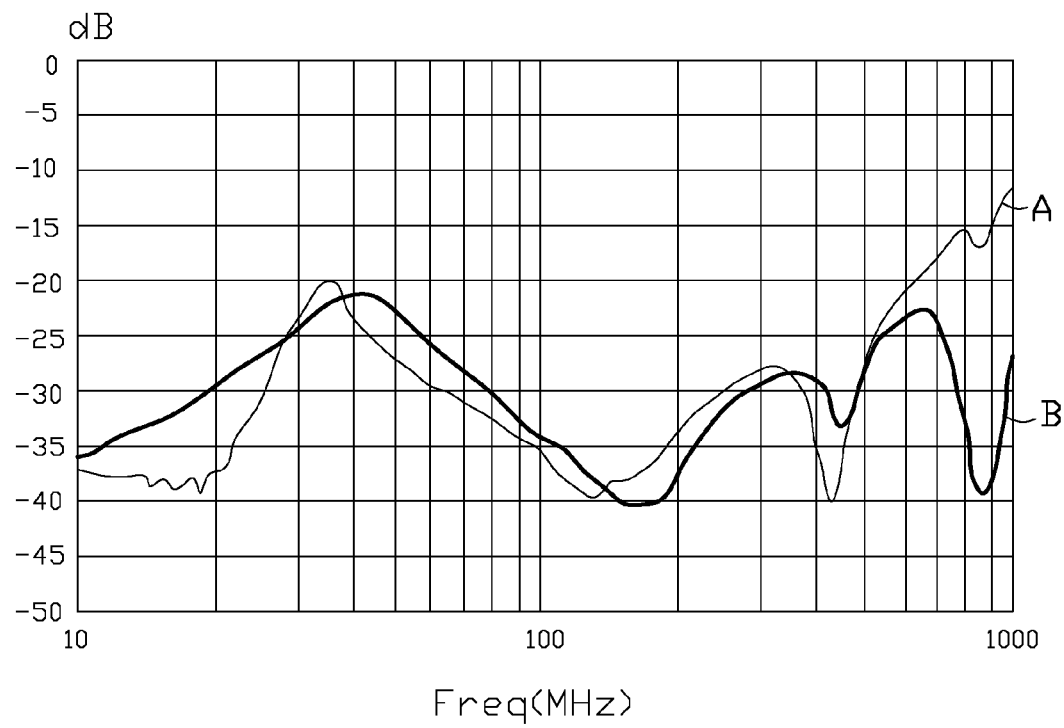
FIG. 4 is a test chart of common mode attenuation with different frequency noise.

Referring to FIG. 4, line A shows an existing magnetic interface circuit's test data and line B shows the present invention's test data. As shown in FIG. 4, the present invention has a better filtering performance (common mode noise reduction) comparing to existing magnetic interface circuit in high frequency noise (or high speed transmit).

Figure 2:
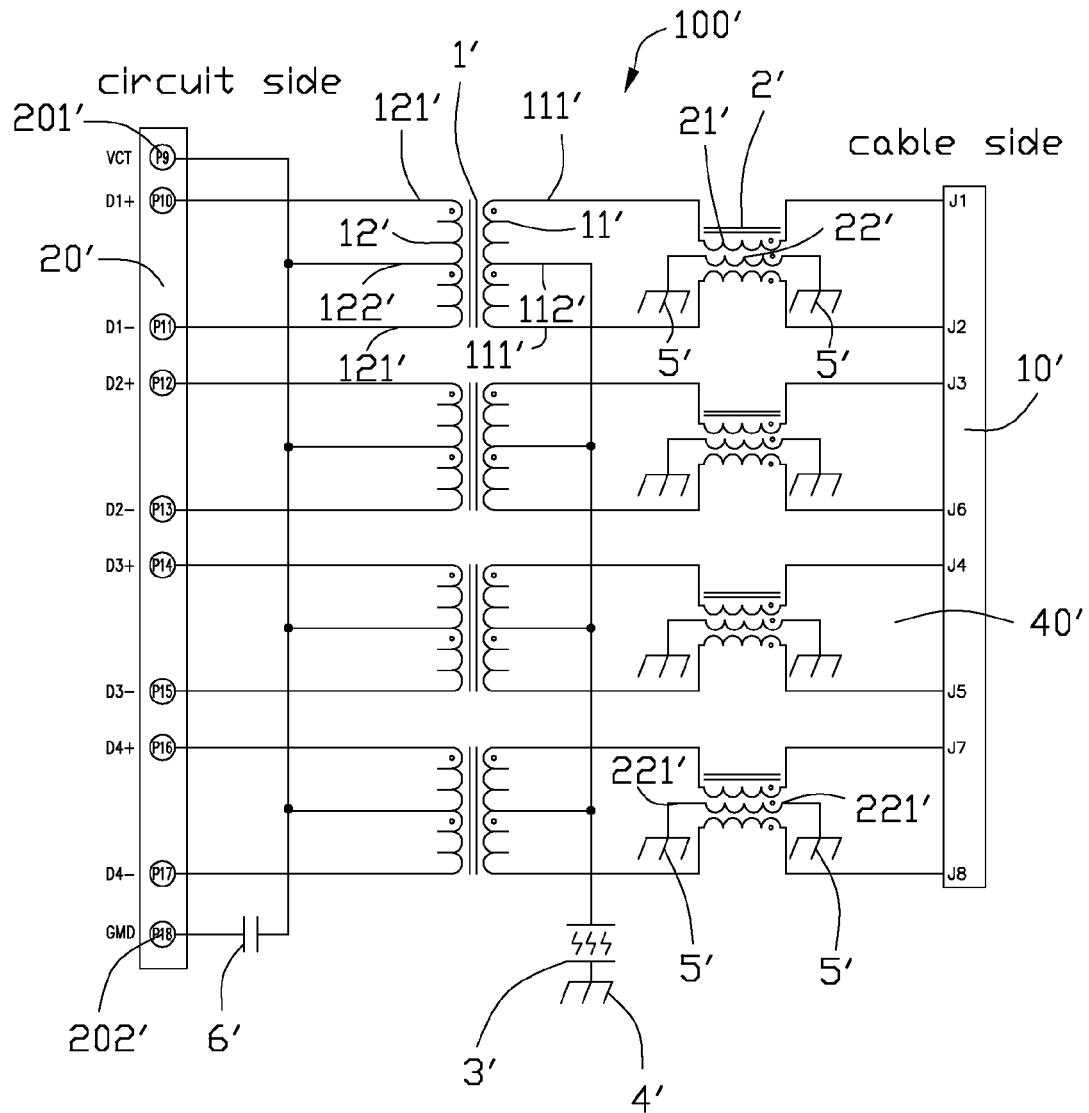
FIG. 2 shows a magnetic interface circuit of a second embodiment in accordance with the present invention.

FIG. 2 is a magnetic interface circuit 100' of a second embodiment in accordance with the present invention, which also has a better filtering performance compared to existing magnetic interface circuit in high frequency noise.

The magnetic interface circuit 100' is used for a modular jack connecting between a network cable and a circuit board and is interfaced between a cable side 10' and a circuit side 20' of a networking communication channel. The magnetic interface circuit 100' includes four transmit channel 40'. Each transmit channel 40' is identical and includes an isolation transformer 1' and a 3-wire CMC 2' with one of the windings of the isolation transformer 1' connected to the circuit side 20' and the 3-wire CMC 2' connected between the other winding of the isolation transformer 1' and the cable side 20' of the channel. The transformer 1' has a first winding 11' connected to the cable side 10' and a second winding 12' connected to the circuit side 20'. The first winding 11' has two outputs 111' connected to the cable side 10' and a first center tap 112' connecting to a discharge device 3' for connecting to ground 4'. The discharge device 3' is formed of two adjacent conductive pads disposed on a printed circuit board. The discharge device 3' also could be replaced by a capacitor or a capacitor connecting with four resistors (Bob-smith circuit). The second winding 12' has two outputs 121' and a second center tap 122' connecting to the circuit side 20'. The 3-wire CMC 2' has a center winding 22' and two outer windings 21'. The two outer windings 21' is connected between the two outputs 111' of the first winding 11' and the circuit side 20'. The center winding 22' does not connect with the transformer 1' but has two opposite ends 221' both using for connecting to ground 5'. The circuit side 20' has a power supply 201' and a grounding point 202'. The power supply 201' is parallel connected with the grounding point 202'. The second center tap 122' is series connected with the power supply 201' and the grounding pointing 202' respectively. There is a capacitor 6' series connected between the second center tap 122' and the grounding point 202'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the members in which the appended claims are expressed.

What is claimed is:

1. A magnetic interface circuit for interfacing between a cable side and a circuit side of a networking communication channel, comprising:
    a transformer having a first winding electromagnetically connected to the cable side of the channel and a second winding connected to the circuit side of the channel, each of the first and second windings having two output ports; and
    a 3-wire common mode choke having a center winding and two outer windings, the two outer windings being respectively connected to the two output ports of the first or second winding, the center winding having two opposite ends directly connected to ground;
    wherein the first winding has a first center tap connected to ground through a discharge device.

2. The magnetic interface circuit as claimed in claim 1, wherein the discharge device is formed of two adjacent conductive pads disposed on a printed circuit board.

3. The magnetic interface circuit as claimed in claim 1, wherein the two outer windings of the 3-wire common mode choke are respectively connected to the two output ports of the first winding.

4. The magnetic interface circuit as claimed in claim 1, wherein the two outer windings of the 3-wire common mode choke are respectively connected to the two output ports of the second winding.

5. The magnetic interface circuit as claimed in claim 1, wherein the discharge device includes a capacitor.

6. The magnetic interface circuit as claimed in claim 1, wherein the second winding has a second center tap connected to the circuit side of the channel.

7. The magnetic interface circuit as claimed in claim 6, further comprising a power supply and a grounding point connected in parallel on the circuit side, and wherein the second center tap is connected in series with the power supply and the grounding point, respectively.

8. The magnetic interface circuit as claimed in claim 7, further including a capacitor connected in series between the second center tap and the grounding point.

9. A magnetic interface circuit for interfacing between a cable side and a circuit side of a networking communication channel, comprising:
    a transformer having a first winding electromagnetically connected to the cable side of the channel, and a second winding interacting with the first winding and connected to the circuit side of the channel, each of the first and second windings having two output ports;
    a 3-wire common mode choke having a center winding and two outer windings interacting with one another, the two outer windings being respectively connected to of the two output ports of one of the first and the second winding, the center winding having two opposite ends directly connected to ground; and
    a power supply and a grounding point connected in parallel on the circuit side;
    wherein the second winding has a second center tap connected to the circuit side of the channel, and wherein the second center tap is connected in series with the power supply and the grounding point, respectively.

10. The magnetic interface circuit as claimed in claim 9, wherein the first winding has a first center tap connected to ground through a discharge device.

11. The magnetic interface circuit as claimed in claim 10, wherein the discharge device is formed of two adjacent conductive pads disposed on a printed circuit board.

12. The magnetic interface circuit as claimed in claim 10, wherein the discharge device includes a capacitor.

13. The magnetic interface circuit as claimed in claim 9, wherein the two outer windings of the 3-wire common mode choke are respectively connected to the two output ports of the first winding.

14. The magnetic interface circuit as claimed in claim 9, wherein the two outer windings of the 3-wire common mode choke are respectively connected to the two output ports of the second winding.

15. The magnetic interface circuit as claimed in claim 9, further including a capacitor connected in series between the second center tap and the grounding point.

* * * * *